United States Patent
Li et al.

(10) Patent No.: US 9,583,619 B2
(45) Date of Patent: Feb. 28, 2017

(54) SEMICONDUCTOR DEVICES WITH SHAPED CAVITIES FOR EMBEDDING GERMANIUM MATERIAL AND MANUFACTURING PROCESSES THEREOF

(71) Applicant: Shanghai Huali Microelectronics Corporation, Shanghai (CN)

(72) Inventors: Fang Li, Shanghai (CN); Yefang Zhu, Shanghai (CN); Kun Chen, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 14/691,508

(22) Filed: Apr. 20, 2015

(65) Prior Publication Data

US 2016/0240672 A1     Aug. 18, 2016

(30) Foreign Application Priority Data

Feb. 13, 2015   (CN) .......................... 2015 1 0079513

(51) Int. Cl.
| | | |
|---|---|---|
| *H01L 29/78* | (2006.01) | |
| *H01L 29/737* | (2006.01) | |
| *H01L 29/161* | (2006.01) | |
| *H01L 29/165* | (2006.01) | |
| *H01L 29/66* | (2006.01) | |
| *H01L 29/08* | (2006.01) | |
| *H01L 21/02* | (2006.01) | |
| *H01L 21/306* | (2006.01) | |
| *H01L 21/308* | (2006.01) | |

(52) U.S. Cl.
CPC .... *H01L 29/7848* (2013.01); *H01L 21/02532* (2013.01); *H01L 21/3083* (2013.01); *H01L 21/30608* (2013.01); *H01L 29/0847* (2013.01); *H01L 29/161* (2013.01); *H01L 29/165* (2013.01); *H01L 29/6653* (2013.01); *H01L 29/6656* (2013.01); *H01L 29/66636* (2013.01); *H01L 29/7378* (2013.01)

(58) Field of Classification Search
CPC . H01L 29/7848; H01L 29/161; H01L 29/165; H01L 29/6656; H01L 29/66636; H01L 29/0847; H01L 29/7378; H01L 21/02532; H01L 21/30604; H01L 21/02164; H01L 21/0217; H01L 21/31116; H01L 21/30608; H01L 21/042; H01L 21/7621
See application file for complete search history.

(56) References Cited

U.S. PATENT DOCUMENTS

| | | |
|---|---|---|
| 6,906,400 B2 | 6/2005 | Delhougne et al. |
| 6,946,350 B2 | 9/2005 | Lindert et al. |
| 6,949,482 B2 | 9/2005 | Murthy et al. |

(Continued)

FOREIGN PATENT DOCUMENTS

EP     1801864     11/2009

*Primary Examiner* — Galina Yushina
(74) *Attorney, Agent, or Firm* — Kilpatrick Townsend & Stockton LLP (57) ABSTRACT

The present invention is directed to semiconductor processes and devices. More specifically, embodiments of the present invention provide a shaped cavity that this later to be filled with SiGe material. The shape cavity comprises convex regions interfacing the substrate. There are other embodiments as well.

4 Claims, 7 Drawing Sheets

(56) References Cited

U.S. PATENT DOCUMENTS

| | | |
|---|---|---|
| 7,494,884 B2 | 2/2009 | Lin et al. |
| 7,553,717 B2 | 6/2009 | Chakravarthi et al. |
| 7,615,390 B2 | 11/2009 | Meunier-Beillard et al. |
| 7,989,298 B1 | 8/2011 | Chan et al. |
| 8,017,487 B2 | 9/2011 | Chong et al. |
| 8,183,118 B2 | 5/2012 | Lu et al. |
| 8,674,447 B2 | 3/2014 | Adam et al. |
| 8,853,060 B1 * | 10/2014 | Lai .................... H01L 21/02532 438/478 |
| 9,087,901 B2 * | 7/2015 | Chen ....................... H01L 29/78 |
| 9,461,145 B2 * | 10/2016 | Yan ................... H01L 29/66545 |
| 2005/0148147 A1 | 7/2005 | Keating et al. |
| 2006/0138398 A1 | 6/2006 | Shimamune |
| 2007/0004123 A1 * | 1/2007 | Bohr ................. H01L 21/30608 438/230 |
| 2008/0128746 A1 * | 6/2008 | Wang .................. H01L 29/7848 257/190 |
| 2008/0290370 A1 | 11/2008 | Han |
| 2009/0134381 A1 * | 5/2009 | Shimamune ...... H01L 21/02381 257/19 |
| 2012/0319120 A1 | 12/2012 | He et al. |
| 2012/0319168 A1 | 12/2012 | Liu et al. |
| 2012/0326268 A1 | 12/2012 | Kato et al. |
| 2013/0001698 A1 * | 1/2013 | Waite ............... H01L 21/26506 257/365 |
| 2014/0159124 A1 * | 6/2014 | Doris ................. H01L 29/6653 257/288 |
| 2014/0322879 A1 * | 10/2014 | Li ..................... H01L 21/30608 438/285 |

\* cited by examiner

Prior Art

SEMICONDUCTOR DEVICES WITH SHAPED CAVITIES FOR EMBEDDING GERMANIUM MATERIAL AND MANUFACTURING PROCESSES THEREOF

CROSS-REFERENCES TO RELATED APPLICATIONS

The present application claims priority to Chinese Patent Application No. 201510079513.0, filed on Feb. 13, 2015, entitled "SEMICONDUCTOR DEVICES WITH SHAPED CAVITIES FOR EMBEDDING GERMANIUM MATERIAL AND MANUFACTURING PROCESSES THEREOF", which is incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to semiconductor processes and devices.

Since the early days when Dr. Jack Kilby at Texus Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and pushing toward the boundary of what physically possible. Huali Microeletronic Corporation™ is one of the leading semiconductor fabrication companies that has focused on the research and development of semiconductor devices and processes.

One of the recent developments in semiconductor technologies has been utilization of silicon germanium (SiGe) in semiconductor manufacturing. For example, SiGe can be used for manufacturing complementary metal-oxide-semiconductor (CMOS) with adjustable band gap. While conventional techniques exist for SiGe based processes, these techniques are unfortunately inadequate for the reasons provided below. Therefore, improved methods and systems are desired.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present invention is directed to semiconductor processes and devices. More specifically, embodiments of the present invention provide a shaped cavity that is later to be filled with SiGe material. The shape cavity comprises convex regions interfacing the substrate. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings), may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. Section 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

As mentioned above, there are many challenges as semiconductor processes scale down. Downscaling IC provides many advantages, including reduction in power consumption and increase in computation speed, as electrons travel less distance from one IC component to another. For example, for CMOS devices, as the sizes of various critical dimension (e.g., size of gate oxide) decrease, the carrier mobility drops quickly, which adversely affects device performance. SiGe technology, when utilized in various applications, can improve device performance by improving carrier mobility.

For certain types of devices and manufacturing processes thereof, SiGe technology can significantly improve device performance. For example, Intel™ explored the usage of SiGe when using 90 nm process to improve the performance of logic units. As the manufacturing processes moved to 45 nm, 32 nm, and 22 nm, the amount of germanium content increased. In the early SiGe devices, germanium makes up less than 15% of the device. As device size decreases, the amount of germanium increase to 40% or even higher. For example, in a CMOS device, SiGe material is embedded in the source and drain regions. In the past, to increase the amount of embedding of SiGe material, U-shaped and Σ-shaped cavities (or sometimes referred to as recesses) have been proposed for embedding the SiGe materials.

As an example, SiGe technology refers to semiconductor devices and processes that utilize SiGe material to improve device performance. For example, SiGe can be used in heterojunction bipolar transistor (HBT) that offers advantages over both conventional silicon bipolar and silicon CMOS for implementation of communications circuits. Among other features, the use of Ge material in these devices improves device performance. However, SiGe devices and processes have their challenges. Among other things, there are difficulties in growing lattice-matched SiGe alloy on Si. Uniformly growing SiGe at the Si-STI interface is desirable, as it increases the performance of the CMOS device. For example, SiGe processes for manufacturing CMOS and other types of devices may comprise various detention of logic gate patterning, such as 45/40 nm, 32/28 nm, and <22 nm, and it is important to maintain logic gate patterns and geometries.

Figure 1:
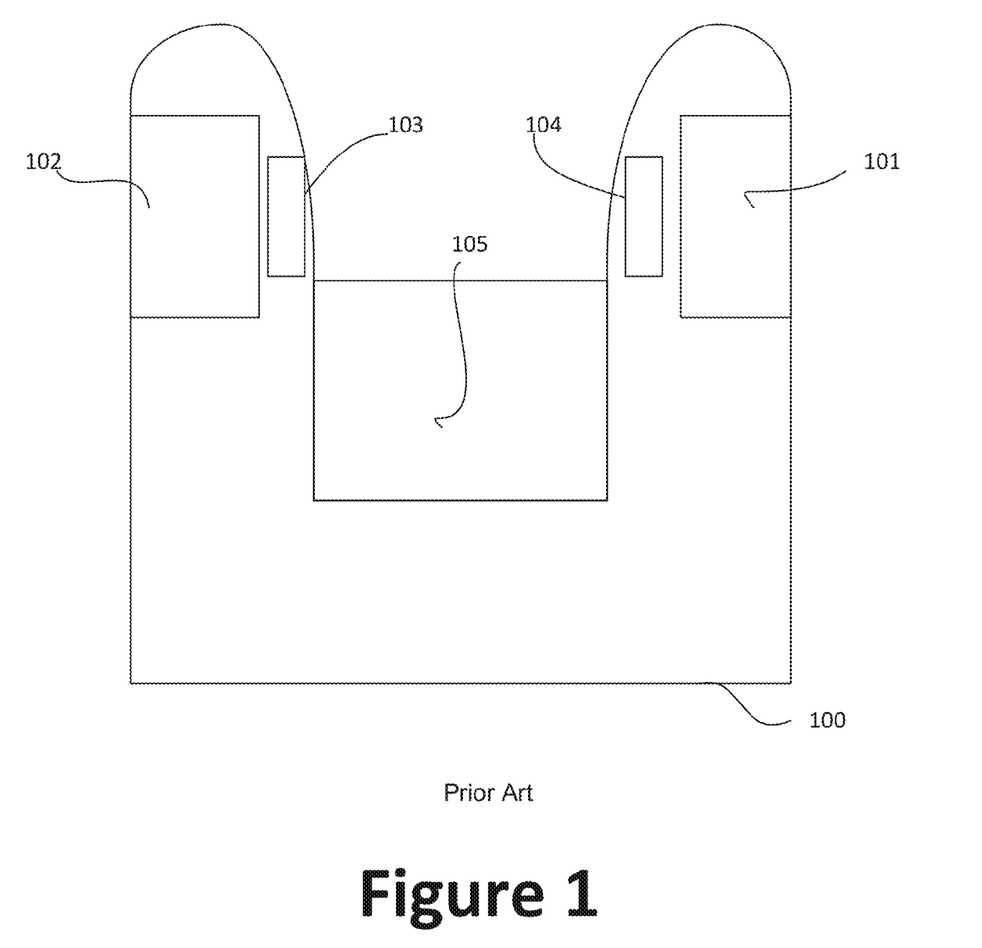
FIG. 1 is a simplified diagram illustrating a conventional U-shaped cavity for SiGe material.

FIG. 1 is a simplified diagram illustrating a conventional U-shaped cavity for SiGe material. A semiconductor substrate 100 comprises a U-shaped cavity for accommodating the filling material 105. For example, the substrate 100 comprises substantially single silicon material. The filling material 105 comprises silicon germanium material. As explained above, with germanium material added to silicon material, carrier mobility and other electrical performance characteristics are improved. For example, the filling material 105 is later used for forming a CMOS device. The semiconductor substrate 100 additionally includes gate materials 101 and 102. For example, the gate materials include metal gate material and/or polysilicon gate material. The gate materials 101 and 102 are protected, respectively, by spacers 103 and 104.

As explained above, an important aspect of the SiGe filling material is its size or volume. Large filling material typically translates to better performance, and it is to be appreciated that embodiments of the present invention increases the cavity size of the substrate, thereby significantly increasing the volume of the SiGe filling material.

Figure 2:
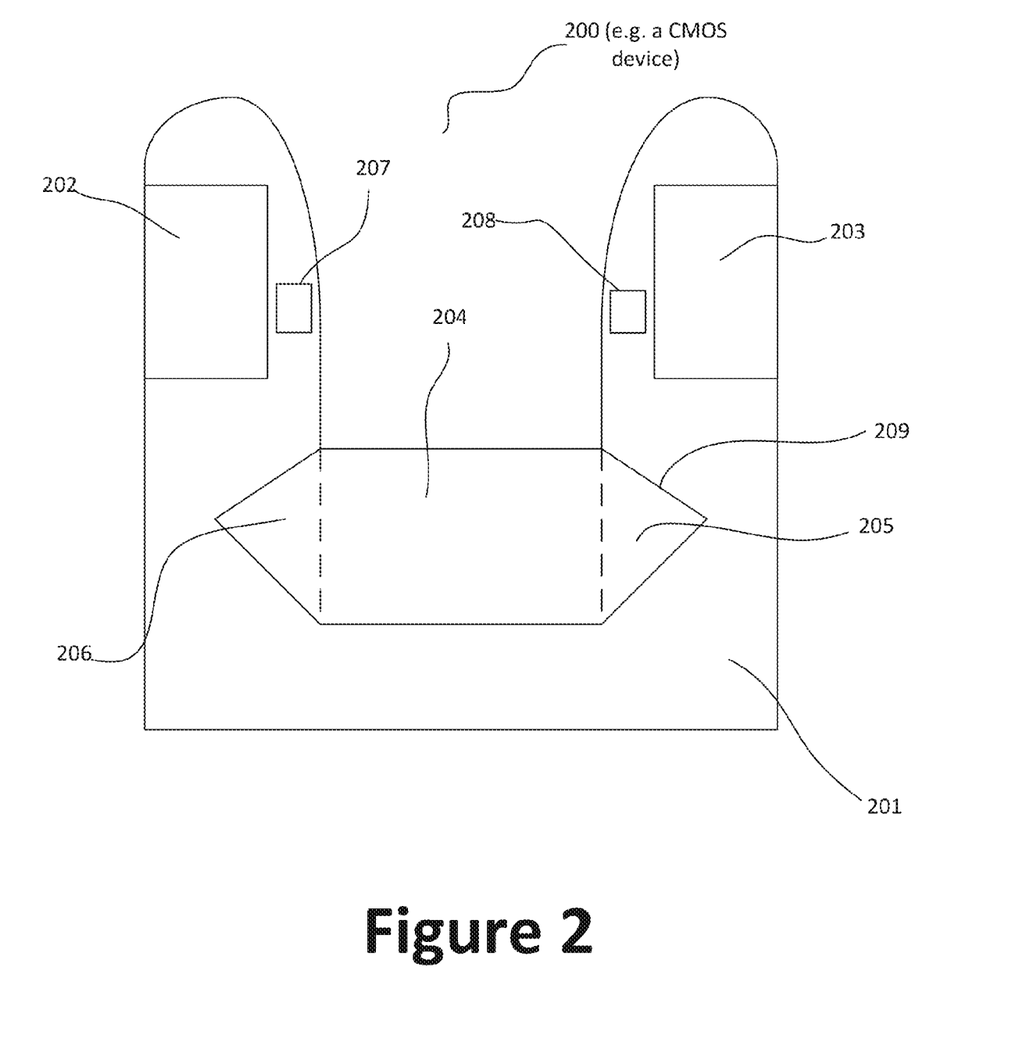
FIG. 2 is a simplified diagram illustrating a cavity structure with side openings according to an embodiment of the present invention.

FIG. 2 is a simplified diagram illustrating a cavity structure with side openings according to an embodiment of the present invention. This diagram is merely an example, which should not unduly limit the scope of the claims. One of ordinary skill in the art would recognize many variations, alternatives, and modifications. In FIG. 2, a semiconductor device 200 includes a substrate 201. As an example, the semiconductor device 200 is a partially manufactured device that is later processed further to include additional components. For example, the semiconductor device 200 is further processed to include, but not limited to, source, drain, and gate regions.

The semiconductor device 200 comprises a substrate 201. For example, the substrate 201 consists essentially of silicon material. For example, the substrate is a part of a silicon wafer. The semiconductor device 200 also includes embedded regions 202 and 203. In certain implementations, regions 202 and 203 comprise polysilicon material. For example, regions 202 and 203 are later processed to form gate regions. In some embodiments, regions 202 and 203 include metal material for forming gate regions. Regions 202 and 203 are protected by spacer 207 and 208. According to various embodiments, spacers 207 and 208 include silicon nitride material. Among other things, the spacers 207 and 208 ensure the opening size of the cavity 209 for embedding the filling material 204. For example, the opening size can be about 20 nm to 50 nm in some implementations. Depending on the device dimensions, opening sizes are possible as well. For example, in 20/22 nm (or smaller) processes, the opening sizes might be smaller. Ensuring the opening size of the cavity, among other benefits, makes filling the cavity with the filling material 204 an easy and consistent process. Without the spacers, the opening of the cavity may deform into other shapes (e.g., rounded corners or edges due to etching).

The filling material 204 comprises silicon germanium (SiGe) material. As explained above, SiGe material embedded in the substrate 201 can improve various electrical characteristics, such as carrier mobility. As illustrated in FIG. 1, cavity for embedding SiGe material is U-shaped in various conventional techniques. It is to be appreciated that the shape of the cavity 209 comprises convex regions 205 and 206, which effectively increases the volume of the cavity 209 and the amount of SiGe material that is later to be filled into the cavity 209.

It is to be appreciated that the SiGe material can be deposited into the cavity 209 in various ways, and thus may have a different composition. For example, the SiGe material may include 10% to 50% germanium content. In addition, concentration of the germanium material vary within the cavity region.

Compared to the Σ-shaped cavity, the shape of cavity 209 provides an increase in volume of about 5% to 10%. The cavity 209 is later filled with SiGe material. Compared to devices with Σ-shaped cavities, a PMOS device with SiGe material filled into the cavity 209 can provide an improvement in PMOS performance of 2% and even greater. In addition to improvements in performance, the cavity shape, according to embodiments of the present invention, can also provide better yield compared to conventional cavity shapes. With a relatively large opening size, the amount of SiGe material filled into the cavity can be effectively controlled. There are other benefits of the cavity shaped illustrated in FIG. 2 according to embodiments of the present invention.

Figure 3:
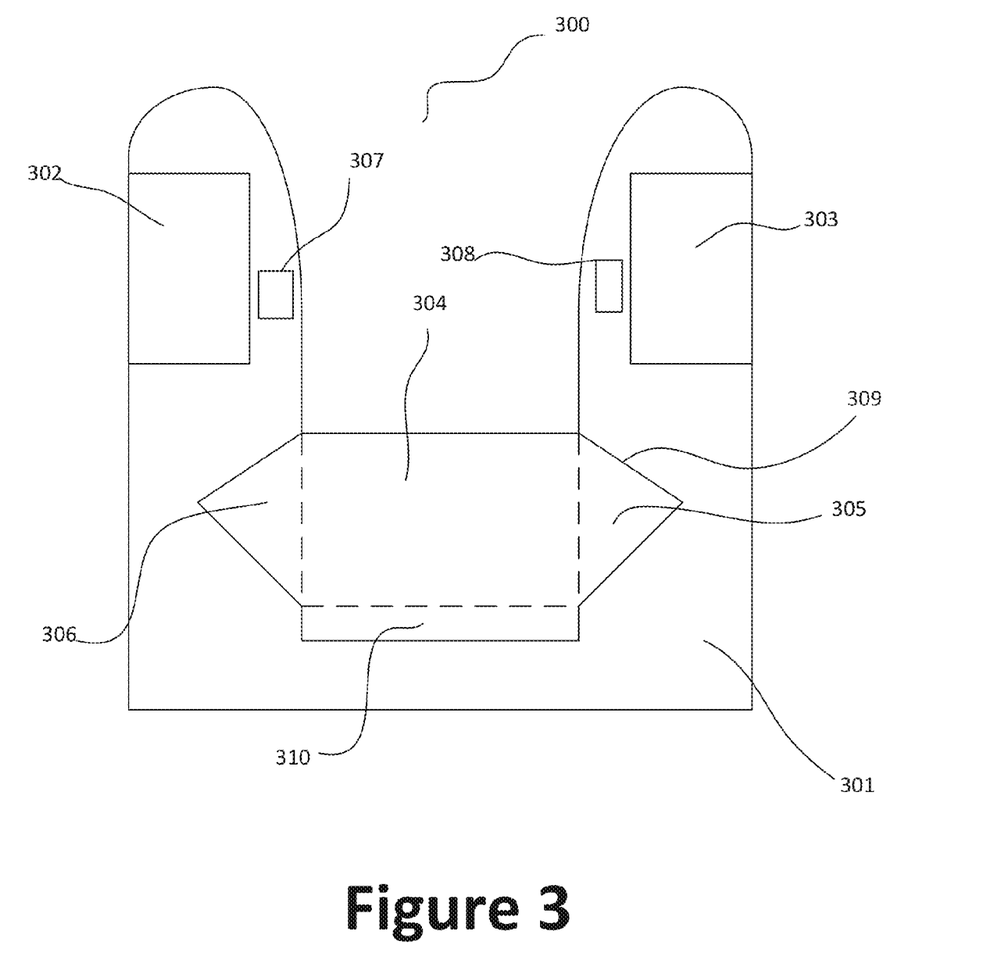
FIG. 3 is a simplified diagram illustrating an alternative cavity structure with side openings according to an embodiment of the present invention.

FIG. 3 is a simplified diagram illustrating an alternative cavity structure with side openings according to an embodiment of the present invention. This diagram is merely an example, which should not unduly limit the scope of the claims. One of ordinary skill in the art would recognize many variations, alternatives, and modifications. In FIG. 3, a semiconductor device 300 includes a substrate 301. As an example, the semiconductor device 300 is a partially manufactured device that is later processed further to include additional components. For example, the semiconductor device 300 is further processed to includes, but not limited to, source, drain, and gate regions.

The semiconductor device 300 comprises a substrate 301. For example, the substrate 301 consists essentially of silicon material. For example, the substrate is a part of a silicon wafer. The semiconductor device 300 also includes embedded regions 302 and 303. In certain implementations, regions 302 and 303 comprise polysilicon material. For example, regions 302 and 303 are later processed to form gate regions. In some embodiments, regions 302 and 303 include metal material for forming gate regions. Regions 302 and 303 are protected by spacer 307 and 308. In various embodiments, spacers 307 and 308 include silicon nitride material. Among other things, the spacers 307 and 308 ensure the opening size of the cavity 309 for embedding the filling material 304. For example, the opening size can be about 20 nm to 50 nm in some implementations. Depending on the device dimensions, opening sizes are possible as well. For example, in 20/22 nm (or smaller) processes, the opening sizes might be smaller. Ensuring the opening size of the cavity, among other benefits, makes filling the cavity with the filling material 304 an easy and consistent process. Without the spacers, the opening of the cavity may deform into other shapes (e.g., rounded corners or edges due to etching). For example, the width of the opening between the spacers 307 and 308 is about the same width of the cavity base region 310.

The filling material 304 comprises silicon germanium (SiGe) material. As explained above, SiGe material embedded in the substrate 301 can improve various electrical characteristics, such as carrier mobility. As illustrated in FIG. 1, cavity for embedding SiGe material is U-shaped in various conventional techniques. It is to be appreciated that the shape of the cavity 309 comprises convex regions 305 and 306, which effectively increases the volume of the cavity 309 and the amount of SiGe material that is later to be filled into the cavity 309. Additionally, the cavity 309 includes a bottom region 310 that is substantially straight. For example, the bottom region 310 can effectively increase cavity volume for accommodating additional filing materials.

It is to be appreciated that the SiGe material can be deposited into the cavity 309 in various ways, and thus may have a different composition. For example, the SiGe material may include 10% to 50% germanium content. In addition, concentration of the germanium material vary within the cavity region.

Compared to the Σ-shaped cavity, the shape of cavity 309 provides an increase in volume of about 5% to 10%. The cavity 309 is later filled with SiGe material. Compared to devices with Σ-shaped cavities, a PMOS device with SiGe material filled into the cavity 309 can provide an improvement in PMOS performance of 2% and even greater. In addition to improvements in performance, the cavity shape according to embodiments of the present invention can also provide better yield compared to conventional cavity shapes. With a relatively large opening size, the amount of SiGe material filled into the cavity can be effectively controlled. There are other benefits of the cavity shape illustrated in FIG. 3 according to embodiments of the present invention.

FIGS. 4A-H are simplified diagrams illustrating a processing for manufacturing a cavity structure according to an embodiment of the present invention. These diagrams merely provide an example, which should not unduly limit the scope of the claims. One of ordinary skill in the art would recognize many variations, alternatives, and modifications. For example, various steps illustrated in FIGS. 4A-H can be added, removed, replaced, repeated, modified, rearranged, and/or overlapped, and should not unduly limit the scope of claims.

Figure 4A:
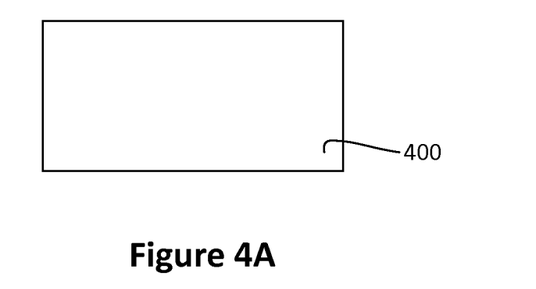
FIGS. 4A-H are simplified diagrams illustrating a processing for manufacturing a cavity structure according to an embodiment of the present invention.

As shown in FIG. 4A, a silicon substrate 400 is provided. For example, the silicon substrate 400 is a part of a semiconductor wafer, on which a large number of substrates with structures (e.g., cavity) similar to that of the substrate 400 are manufactured. In various embodiments, the silicon substrate 400 is subjected to surface treatment, such as polishing, cleaning, and/or others.

Figure 4B:
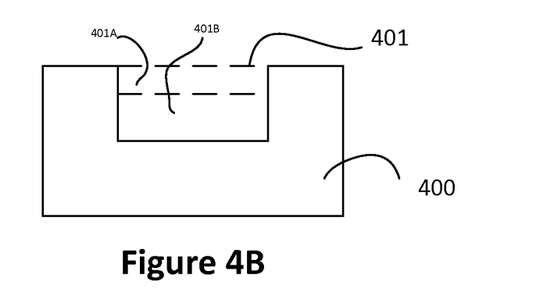

The silicon substrate 400 is then etched to form an initial cavity 401, as shown in FIG. 4B. The dimensions (e.g., width, depth, etc.) of the initial cavity 401 are predefined based on the semiconductor devices that are to be manufactured. In various embodiments, the opening size and shape is defined by a lithography process, and the initial cavity 401 is formed by a plasma etching process. In certain implementations, the surface of the initial cavity 401 is further processed to remove residues from the etching process.

Figure 4C:
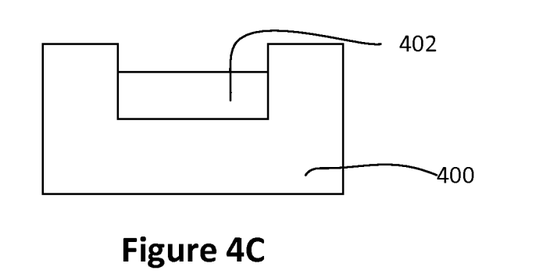
Figure 4D:
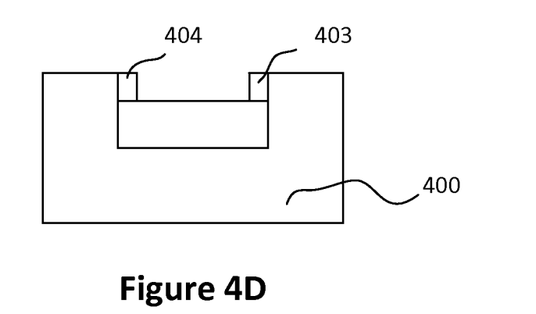

A layer 402 is formed within the initial cavity 401, as shown in FIG. 4C. The initial cavity 401 has a top portion 401A and a bottom portion 401B. The layer 402 is formed at the bottom portion 401B of the cavity. In various embodiments, the layer 402 comprises silicon oxide materials, which facilitates the formation of spacers 403 and 404 shown in FIG. 4D. The silicon oxide materials can be formed in various ways, such as deposition, oxidation, etc.

The spacers 404 and 403 can be formed by directional film deposition process. As explained above, the spacers 404 and 403 as shown in FIG. 4E help retain the opening size and shape of initial cavity 409 and the shaped cavity that is later to be formed. The spacers 403 and 404 are formed on the sidewalls of the top portion 401A of the cavity. In various embodiments, the spacer 403 and 404 comprises silicon nitride material (e.g., SiN). For example, the chemical composition of the spacer 403 and 404 are specifically selected to be different from that of the substrate and the layer 402, which can stay intact when the substrate the layer 402 materials (e.g., silicon) are etched away for forming a convex portion of the cavity. In various embodiments, the subsequent etching of the substrate material is performed using hydrogen fluoride (HF) material, and the spacer 403 and 404 is chemically resistant to HF.

Figure 4E:
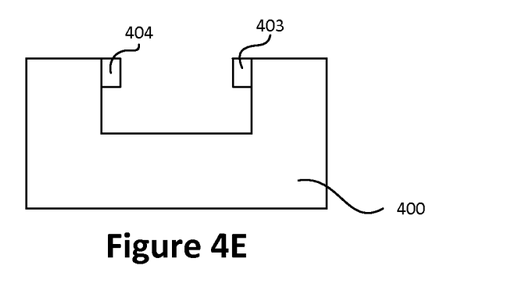

The layer 402, which comprises silicon oxide material, is removed after formation of the spacers 403 and 404, as shown in FIG. 4E. For example, layer 402 is removed by one or more wet etching process utilizing HF as an etchant. The etchant HF substantially removes layer 402, and its impact to the spacers 403 and 404 is minimal. As can be seen in FIG. 4E, spacers 403 and 404 are substantially intact while the layer 402 is removed. Once layer 402 is removed, the bottom portion 401B of the initial cavity 401 is again exposed.

Figure 4F:
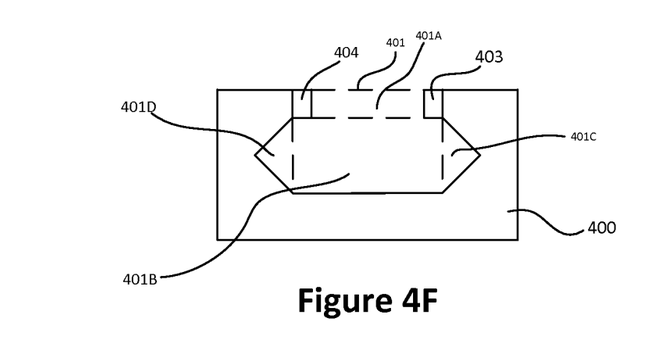

The convex regions 401D and 401C of the cavity are then formed, as shown in FIG. 4F. As can be seen, the convex regions 401C and 401D are formed at the bottom portion 401B of the cavity 401. With the protection of the spacers 403 and 404, the sidewalls at the top portion of the cavity 401 are not etched away. In various implementations, the convex regions 401C and 401D are formed by an etching process. Depending on the specific implementation, various types of the etchants can be used. In a specific embodiment, Tetramethylammonium hydroxide (TMAH) is used as an etchant, which effectively removes silicon substrate material without affecting the spacers 403 and 404 much. Depending on the implementation, other types of etchants can be used as well.

Figure 4G:
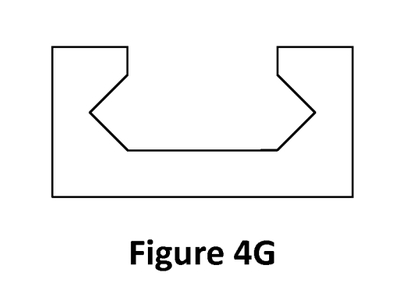

The spacers 403 and 404 are then removed, as shown in FIG. 4G. According to various embodiments, the spacers 403 and 404 comprises SiN material that can be removed by $H_3PO_4$ material. For example, $H_3PO_4$ selectively removes spacers 403 and 404 without removing silicon substrate or the cavity material.

Figure 4H:
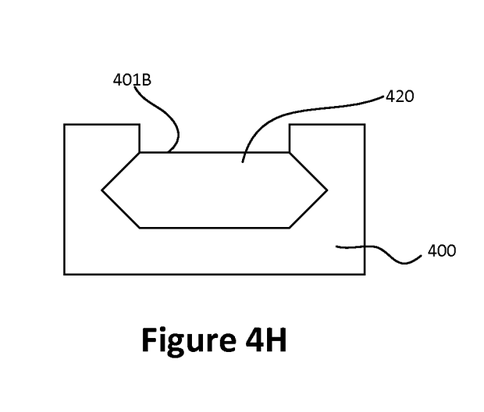

SiGe material is then formed within the shaped cavity 401, as shown in FIG. 4H. For example, the SiGe material filled into the bottom portion 401B of the cavity 401 through one or more deposition processes. For example, a mixture of silicon and germanium gaseous species are deposited into the shaped cavity through a vapor deposition process. In various embodiments, the germanium material may make up about 10% to 40% of the filling material 420. The filling material 420 fills into the convex regions of the shaped cavity as well. As an example, the filed SiGe material has filled the bottom portion 401B of the cavity 401. Depending on the implementation, the SiGe material may additionally be filled into the top portion of the shaped cavity 401 as well. After the SiGe material is filled into the shaped cavity, other processes may be performed as well. For example, additional steps are performed to form source, drain, and gate regions, which are parts of a CMOS circuit.

Figure 5A:
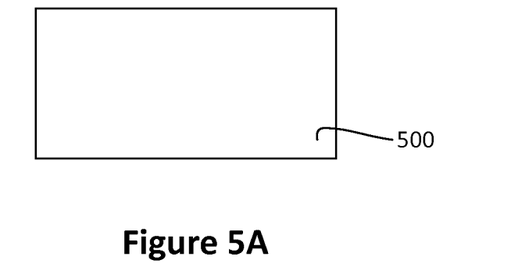
FIGS. 5A-H are simplified diagrams illustrating a processing for manufacturing an alternative cavity structure according to an embodiment of the present invention.

FIGS. 5A-H are simplified diagrams illustrating a processing for manufacturing an alternative cavity structure according to an embodiment of the present invention. These diagrams merely provide an example, which should not unduly limit the scope of the claims. One of ordinary skill in the art would recognize many variations, alternatives, and modifications. For example, various steps illustrated in FIGS. 5A-H can be added, removed, replaced, repeated, modified, rearranged, and/or overlapped, and should not unduly limit the scope of claims. As shown in FIG. 5A, a silicon substrate 500 is provided. For example, the silicon substrate 500 is a part of a semiconductor wafer, on which a large number of substrates with structures (e.g., cavity) similar to that of the substrate 500 are manufactured. In various embodiments, the silicon substrate 500 is subjected to surface treatment, such as polishing, cleaning, and/or others.

Figure 5B:
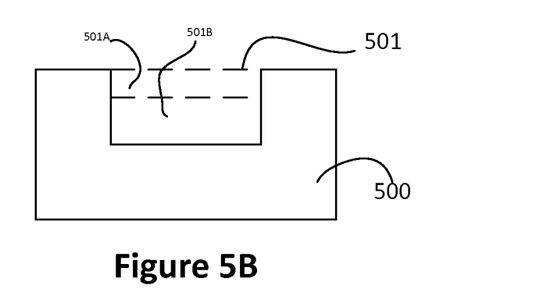

The silicon substrate 500 is then etched to form an initial cavity 501, as shown in FIG. 5B. The dimensions (e.g., width, depth, etc.) of the initial cavity 501 are predefined based on the semiconductor devices that are to be manufactured. In various embodiments, the opening size and shape is defined by a lithography process, and the initial cavity 501 is formed by a plasma etching process. In certain implementations, the surface of the initial cavity 501 is further processed to remove residues from the etching process.

Figure 5C:
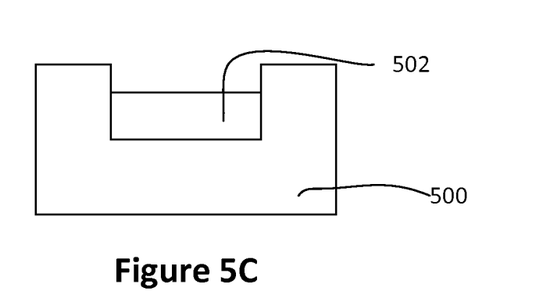
Figure 5D:
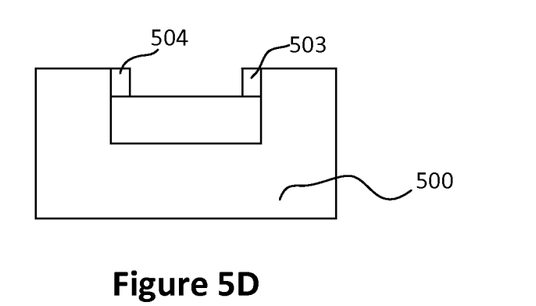

A layer 502 is formed within the initial cavity 501, as shown in FIG. 5C. The initial cavity 501 has a top portion 501A and a bottom portion 501B. The layer 502 is formed at the bottom portion 501B of the cavity. In various embodiments, the layer 502 comprises silicon oxide materials, which facilitates the formation of spacers 503 and 504 shown in FIG. 5D. The silicon oxide materials can be formed in various ways, such as deposition, oxidation, etc.

The spacers 504 and 503 can be formed by a directional film deposition process. As explained above, the spacers 504 and 503 as shown in FIG. 5E help retain the opening size and shape of initial cavity 501 and the shaped cavity that is later to be formed. The spacers 503 and 504 are formed on the sidewalls of the top portion 501A of the cavity. In various embodiments, the spacer 503 and 504 comprises silicon nitride material (e.g., SiN). For example, the chemical composition of the spacer 503 and 504 are specifically selected to be different from that of the substrate and the layer 502, which can stay intact when the substrate the layer 502 materials (e.g., silicon) are etched away for forming a convex portion of the cavity. In various embodiments, the subsequent etching of the substrate material is performed using hydrogen fluoride (HF) material, and the spacer 503 and 504 is chemically resistant to HF.

Figure 5E:
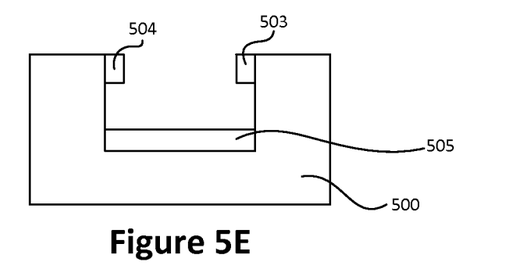

The layer 502, which comprises silicon oxide material, is removed after formation of the spacers 503 and 504, as shown in FIG. 5E. For example, layer 502 is removed by one or more wet etching process utilizing HF as an etchant. The etchant HF substantially removes layer 502, and its impact to the spacers 503 and 504 is minimal. As can be seen in FIG. 5E, spacers 503 and 504 are substantially intact while the layer 502 is removed. Once layer 502 is removed, the bottom portion 501B of the initial cavity 501 is again exposed.

After the layer 502 is removed, a bottom layer 505 is formed. For example, the bottom layer 505 is specifically configured to help retain the bottom shape and size of the cavity. For example, the bottom layer 505 is positioned at the bottom portion of the cavity, but it only makes up a smaller portion of the bottom portion 501B of the cavity; a part of the bottom portion 501B of the cavity is not covered by the bottom layer 505, thereby allowing part of the substrate sidewall to be removed to form convex shaped portions. In various implementations, the bottom layer 505 comprises silicon nitride material (e.g., SiN). Among other things, the bottom layer 505 is to remain intact, and thereby protecting the portion of the substrate 500 that it overlays. For example, the bottom layer 505 is chemically resistant to etchants such as HF material.

Figure 5F:
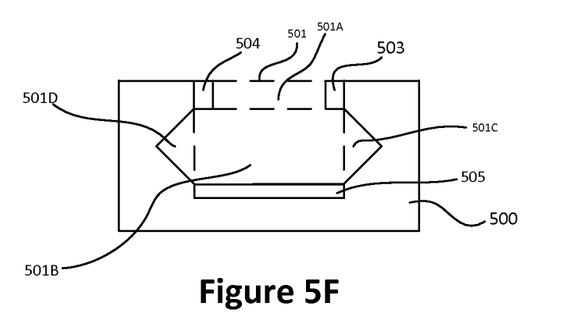

The convex regions 501D and 501C of the cavity are then formed, as shown in FIG. 5F. As can be seen, the convex regions 501C and 501D are formed at the bottom portion 501B of the cavity 501. With the protection of the spacers 503 and 504, the sidewalls at the top portion of the cavity 501 are not etched away. Also, as shown in FIG. 5F, the bottom layer 505 and the silicon substrate 500 thereunder also remain untouched during the etching process. In various implementations, the convex regions 501C and 501D are formed by an etching process. Depending on the specific implementation, various types of the etchants can be used. In a specific embodiment, Tetramethylammonium hydroxide (TMAH) is used as an etchant, which effectively removes silicon substrate material without affecting the spacers 503 and 504 much. Depending on the implementation, other types of etchants can be used as well.

Figure 5G:
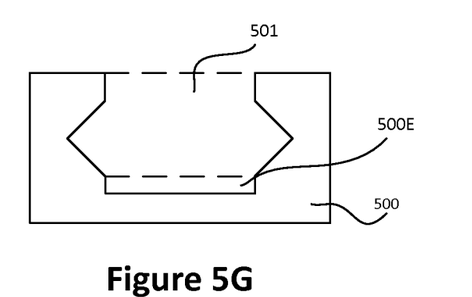

The spacers 503 and 504, and the bottom layer 505, are then removed, as shown in FIG. 5G. According to various embodiments, the spacers and the bottom layer 505 comprise SiN material that can be removed by $H_3PO_4$ material. For example, $H_3PO_4$ selectively removes spacers and the bottom layer 505 without removing silicon substrate 500 or the cavity material. Upon removing the bottom layer 505, an additional region 500E of the shaped cavity 501 is now exposed and available for accommodating filling material.

Figure 5H:
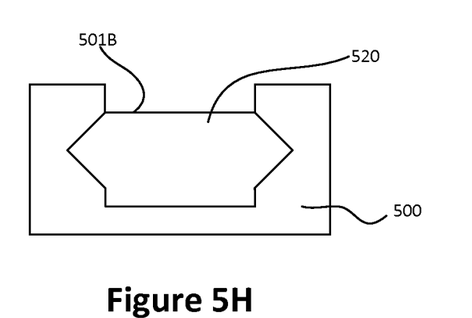

SiGe material is then formed within the shaped cavity 501, as shown in FIG. 5H. For example, the SiGe material filled into the bottom portion 501B of the cavity 501 through one or more deposition processes. For example, a mixture of silicon and germanium gaseous species are deposited into the shaped cavity through a vapor deposition process. In various embodiments, the germanium material may make up about 10% to 40% of the filling material 520. The filling material 520 fills into the convex regions 501C and 501E and the bottom region 500E of the shaped cavity as well. As an example, the filed SiGe material is filled into the bottom portion 401B of the cavity 401. Depending on the implementation, the SiGe material may additionally be filled into the top portion of the shaped cavity 501 as well. After the SiGe material is filled into the shaped cavity, other processes may be performed as well. For example, additional steps are performed to form source, drain, and gate regions, which are parts of a CMOS circuit.

Embodiments of the present invention provide many advantages over existing techniques and methods, as explained throughout the parts of the application. It is to be appreciated that embodiments of the present invention are compatible with existing systems and processes. For example, the shaped cavities described according to the embodiments of the present invention can be manufactured using existing equipment. The shaped cavities according to embodiments of the present invention can be easily used in manufacturing various types of devices, such as CMOS, PMOS, NMOS, etc.

According to an embodiment, the present invention provides a semiconductor device that includes a substrate comprising silicon material. The device also includes a first cavity region positioned within the substrate. The first cavity region includes a top portion, a middle portion, and a base portion. The top portion comprises substantially vertical sidewalls. The middle portion includes convex sidewalls interfacing the substrate. The base portion includes a substantially flat bottom surface. The device additionally includes a filling material comprising silicon and germanium material positioned at least partially within the first cavity region.

According to another embodiment, the present invention provides a semiconductor device that includes a substrate comprising silicon material. The device also includes a first cavity region positioned within the substrate. The first cavity region includes a top portion, a middle portion, and a base portion. The top portion includes substantially vertical sidewalls. The middle portion includes convex sidewalls interfacing the substrate. The base portion includes a substantially flat bottom surface and substantially vertical sidewalls. The device also includes a filling material comprising silicon and germanium material positioned at least partially within the first cavity region.

According to yet another embodiment, the present invention provides a method for fabricating a semiconductor device. The method includes providing a substrate that consists essentially of silicon material. The method also includes defining a cavity region on the substrate. The method additionally includes etching the substrate to form a cavity at the cavity region that includes a top portion and a bottom portion. The method also includes forming a layer of silicon oxide material within the bottom portion. The layer of the silicon oxide material interfaces bottom sidewalls of the substrate. The method further includes forming a spacer on sidewalls of the top portion. The method also includes removing the layer of silicon oxide material to expose the bottom sidewalls of the substrate. The method also includes enlarging the bottom portion of the cavity by selectively etching the bottom sidewalls to form a first shaped cavity. The first shaped cavity includes convex portion interfacing with the bottom sidewalls. The method also includes filing the first cavity with a filling material, which includes silicon and germanium material.

While the above is a full description of the specific embodiments, various modifications, alternative constructions and equivalents may be used. In addition to what is described above, there are other embodiments as well. Therefore, the above description and illustrations should not be taken as limiting the scope of the present invention which is defined by the appended claims.

What is claimed is:

1. A semiconductor device comprising:
 a substrate comprising silicon material;
 a first cavity region positioned within the substrate, the first cavity region comprising a top portion, a middle portion, and a base portion, the top portion comprising substantially vertical sidewalls, the middle portion comprising convex sidewalls interfacing the substrate, and the base portion comprising a substantially flat bottom surface; and
 a filling material comprising silicon germanium material positioned at least partially within the first cavity region, wherein:
 the top portion being characterized by a first diameter;
 the base portion being characterized by a second diameter;
 the first diameter is substantially equal to the second diameter.

2. The semiconductor device of claim 1 further comprising a gate, the semiconductor device being a CMOS device.

3. The semiconductor device of claim 1 wherein the middle portion of the first cavity region is characterized by an opening of diameter of at least 30 nm.

4. A semiconductor device comprising:
 a substrate comprising silicon material;
 a first cavity region positioned within the substrate, the first cavity region comprising a top portion, a middle portion, and a base portion, the top portion comprising substantially vertical sidewalls, the middle portion comprising convex sidewalls interfacing the substrate, and the base portion comprising a substantially flat bottom surface and substantially vertical sidewalls; and
 a filling material comprising silicon germanium material positioned at least partially within the first cavity region, wherein:
 the top portion being characterized by a first diameter;
 the base portion being characterized by a second diameter;
 the first diameter is substantially equal to the second diameter.

* * * * *